US008543895B2

(12) United States Patent
Wang et al.

(10) Patent No.: US 8,543,895 B2
(45) Date of Patent: Sep. 24, 2013

(54) LIST VITERBI DECODING OF TAIL BITING CONVOLUTIONAL CODES

(75) Inventors: Renqiu Wang, San Diego, CA (US); Hao Xu, San Diego, CA (US); Yongbin Wei, San Diego, CA (US); Dung Ngoc Doan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 340 days.

(21) Appl. No.: 13/023,430

(22) Filed: Feb. 8, 2011

(65) Prior Publication Data
US 2012/0036416 A1     Feb. 9, 2012

Related U.S. Application Data

(60) Provisional application No. 61/303,239, filed on Feb. 10, 2010.

(51) Int. Cl.
*H03M 13/03*     (2006.01)
(52) U.S. Cl.
USPC ........... 714/795; 714/755; 714/758; 714/794; 714/796
(58) Field of Classification Search
USPC .......................................... 714/755, 794–796
See application file for complete search history.

(56) References Cited

U.S. PATENT DOCUMENTS

| 5,349,589 | A | * | 9/1994 | Chennakeshu et al. | ....... 714/795 |
|---|---|---|---|---|---|
| 6,161,210 | A | | 12/2000 | Chen et al. | |
| 6,199,186 | B1 | * | 3/2001 | Chen et al. | ..................... 714/755 |
| 6,256,764 | B1 | * | 7/2001 | Atallah | .......................... 714/795 |
| 6,452,985 | B1 | * | 9/2002 | Hatakeyama et al. | ........ 375/341 |
| 6,877,132 | B1 | * | 4/2005 | De et al. | ......................... 714/795 |
| 7,203,894 | B2 | * | 4/2007 | Pan et al. | ....................... 714/780 |
| 7,856,591 | B2 | * | 12/2010 | Shi et al. | ........................ 714/795 |

OTHER PUBLICATIONS

International Search Report and Written Opinion—PCT/US2011/024391, International Search Authority—European Patent Office—Apr. 5, 2011.
Seshadri N., et al., "List Viterbi Decoding Algorithms With Applications", IEEE Transactions on Communications, IEEE Service Center, Piscataway, NJ. USA, vol. 42, No. 2/03/04, Feb. 1, 1994, pp. 313-322, XP000445945, ISSN: 0090-6778, DOI: 10.1109/TCOMM.1994.577040.
Mohammad, M., et al., "Comparing List Viterbi Algorithms with and without Tail Bits", Military Communications Conference, 2008. MILCOM 2008. IEEE, Nov. 16-19, 2008.
Chen, B. and Sundberg, C.-E.W., "List Viterbi Algorithms for Continuous Transmission" IEEE Transactions on Communications, vol. 49 No. 5, pp. 784-792, May 2001.
Chen, B. and Sundberg, C.-E.W., "List Viterbi Algorithms for Wireless Systems" Vehicular Technology Conference Proceedings, 2000. VTC 2000—Spring Tokyo. 2000 IEEE 51st, vol. 2, pp. 1016-1020, May 15-18, 2000.

* cited by examiner

*Primary Examiner* — Esaw Abraham
(74) *Attorney, Agent, or Firm* — Nerrie M. Zohn (57) ABSTRACT

A low complexity List Viterbi algorithm (LVA) for decoding tail biting convolutional codes (TBCCs) has lower complexity than a solution of running the LVA algorithm for all states. In one aspect, a low complexity LVA-TBCC process includes finding a list of states from a single Viterbi algorithm and finding a list of potential codewords for each state in the state list using the LVA. A cyclic redundancy check may prune out false solutions. The disclosed method may be applied to many communication systems to improve error performance similar to LTE downlink PBCH decoding enhancements.

16 Claims, 6 Drawing Sheets

LIST VITERBI DECODING OF TAIL BITING CONVOLUTIONAL CODES

CROSS REFERENCE TO RELATED APPLICATION

This application claims the benefit of U.S. provisional patent application No. 61/303,239 filed Feb. 10, 2010, in the names of WANG et al., the disclosure of which is expressly incorporated herein by reference in its entirety.

BACKGROUND

1. Field

Aspects of the present disclosure relate generally to wireless communication systems and, more particularly to, decoding tail biting convolutional codes with a List Viterbi algorithm.

2. Background

Wireless communication networks are widely deployed to provide various communication services such as voice, video, packet data, messaging, broadcast, and the like. These wireless networks may be multiple-access networks capable of supporting multiple users by sharing the available network resources. Such networks, which are usually multiple access networks, support communications for multiple users by sharing the available network resources. One example of such a network is the Universal Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). Examples of multiple-access network formats include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations or node Bs that can support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

SUMMARY

A method for wireless communication system is offered for decoding tail biting convolutional codes (TBCC) with a List Viterbi algorithm (LVA). The method includes receiving a signal containing a TBCC. The method also includes determining a list of potential states from the received signal, a size of the list being Ls, Ls being determined from potential states identified in a single Viterbi algorithm. The method further includes determining a list of potential codewords for each state in the list of potential states, a size of the list of potential codewords being Lc. The method also further includes operating a cyclic redundancy check (CRC) code to determine a final decoding solution for a List Viterbi algorithm (LVA)-tail biting convolutional codes (TBCC) algorithm using the list of potential codewords.

Also offered is an apparatus operable in a wireless communication system and configured to decode tail biting convolutional codes (TBCC) with a List Viterbi algorithm (LVA). The apparatus includes means for receiving a signal containing a TBCC. The apparatus also includes means for determining a list of potential states from the received signal, a size of the list being Ls, Ls being determined from potential states identified in a single Viterbi algorithm. The apparatus further includes means for determining a list of potential codewords for each state in the list of potential states, a size of the list of potential codewords being Lc. The apparatus also further includes means for operating a cyclic redundancy check (CRC) code to determine a final decoding solution for a List Viterbi algorithm (LVA)-tail biting convolutional codes (TBCC) algorithm using the list of potential codewords.

Also offered is a computer program product configured for decoding tail biting convolutional codes (TBCC) with a List Viterbi algorithm (LVA). The computer program product includes a computer-readable medium having program code recorded thereon. The program code includes program code to receive a signal containing a TBCC. The program code also includes program code to determine a list of potential states from the received signal, a size of the list being Ls, Ls being determined from potential states identified in a single Viterbi algorithm. The program code further includes program code to determine a list of potential codewords for each state in the list of potential states, a size of the list of potential codewords being Lc. The program code also further includes program code to operate a cyclic redundancy check (CRC) code to determine a final decoding solution for a List Viterbi algorithm (LVA)-tail biting convolutional codes (TBCC) algorithm using the list of potential codewords.

Also offered is an apparatus configured for decoding tail biting convolutional codes (TBCC) with a List Viterbi algorithm (LVA). The apparatus includes a processor(s) and a memory coupled to the processor(s). The processor(s) is configured to receive a signal containing a TBCC. The processor(s) is also configured to determine a list of potential states from the received signal, a size of the list being Ls, Ls being determined from potential states identified in a single Viterbi algorithm. The processor(s) is further configured to determine a list of potential codewords for each state in the list of potential states, a size of the list of potential codewords being Lc. The processor(s) is also further configured to operate a cyclic redundancy check (CRC) code to determine a final decoding solution for a List Viterbi algorithm (LVA)-tail biting convolutional codes (TBCC) algorithm using the list of potential codewords.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as CDMA, TDMA, FDMA, OFDMA, SC-FDMA and other networks. The terms "network" and "system" are often used interchangeably. A CDMA network may implement a radio technology, such as Universal Terrestrial Radio Access (UTRA), Telecommunications Industry Association's (TIA's) CDMA2000®, and the like. The UTRA technology includes Wideband CDMA (WCDMA) and other variants of CDMA. The CDMA2000® technology includes the IS-2000, IS-95 and IS-856 standards from the Electronics Industry Alliance (EIA) and TIA. A TDMA network may implement a radio technology, such as Global System for Mobile Communications (GSM). An OFDMA network may implement a radio technology, such as Evolved UTRA (E-UTRA), Ultra Mobile Broadband (UMB), IEEE 802.11 (Wi-Fi), IEEE 802.16 (WiMAX), IEEE 802.20, Flash-OFDMA, and the like. The UTRA and E-UTRA technologies are part of Universal Mobile Telecommunication System (UMTS). 3GPP Long Term Evolution (LTE) and LTE-Advanced (LTE-A) are newer releases of the UMTS that use E-UTRA. UTRA, E-UTRA, UMTS, LTE, LTE-A and GSM are described in documents from an organization called the "3rd Generation Partnership Project" (3GPP). CDMA2000® and UMB are described in documents from an organization called the "3rd Generation Partnership Project 2" (3GPP2). The techniques described herein may be used for the wireless networks and radio access technologies mentioned above, as well as other wireless networks and radio access technologies. For clarity, certain aspects of the techniques are described below for LTE or LTE-A (together referred to in the alternative as "LTE/-A") and use such LTE/-A terminology in much of the description below.

Figure 1:
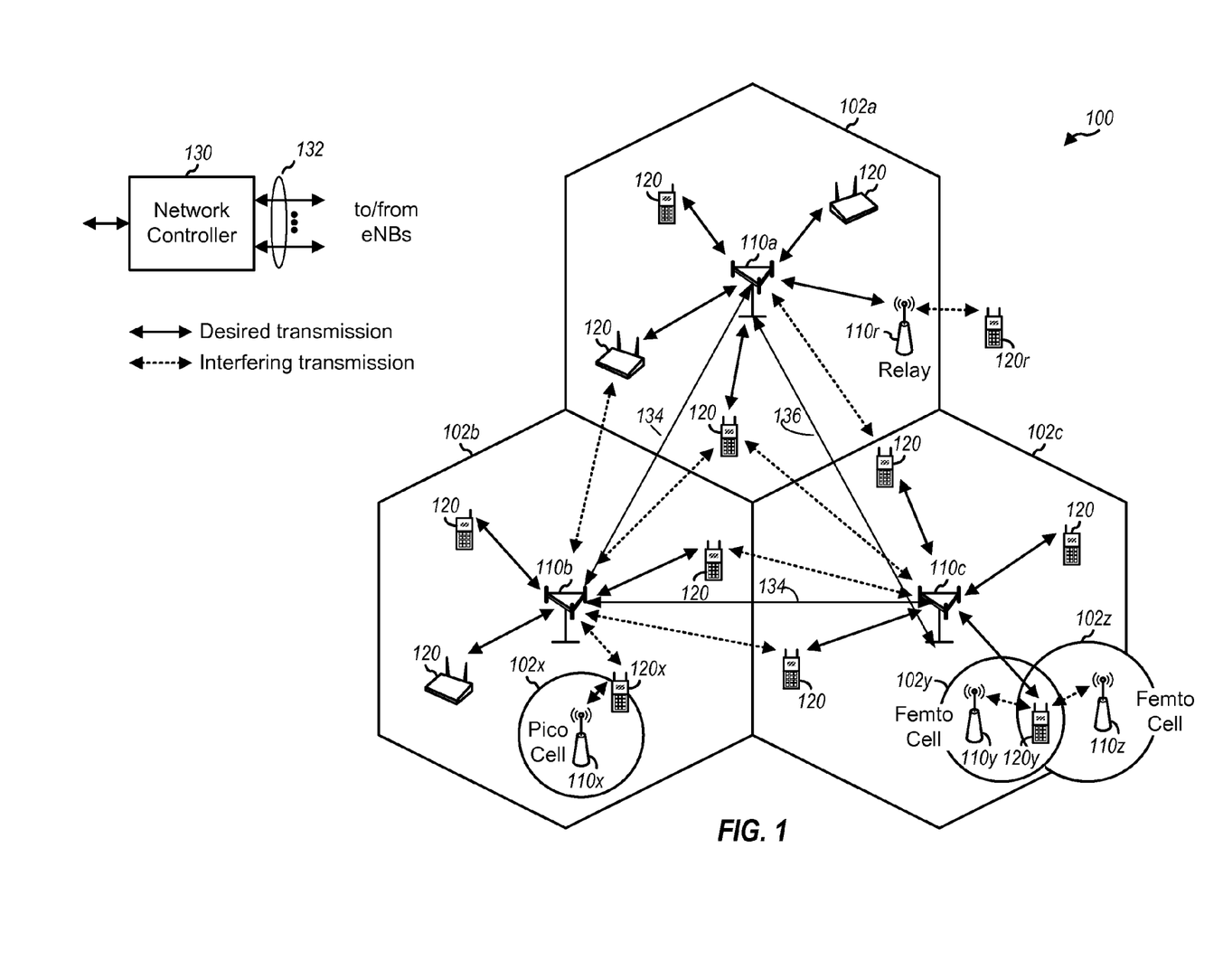
FIG. 1 is a block diagram conceptually illustrating an example of a mobile communication system.

FIG. 1 shows a wireless communication network 100, which may be an LTE-A network. The wireless network 100 includes a number of evolved node Bs (eNBs) 110 and other network entities. An eNB may be a station that communicates with the UEs and may also be referred to as a base station, a node B, an access point, and the like. Each eNB 110 may provide communication coverage for a particular geographic area. In 3GPP, the term "cell" can refer to this particular geographic coverage area of an eNB and/or an eNB subsystem serving the coverage area, depending on the context in which the term is used.

An eNB may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNB for a macro cell may be referred to as a macro eNB. An eNB for a pico cell may be referred to as a pico eNB. And, an eNB for a femto cell may be referred to as a femto eNB or a home eNB. In the example shown in FIG. 1, the eNBs 110a, 110b and 110c are macro eNBs for the macro cells 102a, 102b and 102c, respectively. The eNB 110x is a pico eNB for a pico cell 102x. And, the eNBs 110y and 110z are femto eNBs for the femto cells 102y and 102z, respectively. An eNB may support one or multiple (e.g., two, three, four, and the like) cells.

The wireless network 100 also includes relay stations. A relay station is a station that receives a transmission of data and/or other information from an upstream station (e.g., an eNB, a UE, or the like) and sends a transmission of the data and/or other information to a downstream station (e.g., another UE, another eNB, or the like). A relay station may also be a UE that relays transmissions for other UEs. In the example shown in FIG. 1, a relay station 110r may communicate with the eNB 110a and a UE 120r, in which the relay station 110r acts as a relay between the two network elements (the eNB 110a and the UE 120r) in order to facilitate communication between them. A relay station may also be referred to as a relay eNB, a relay, and the like.

The wireless network 100 may support synchronous or asynchronous operation. For synchronous operation, the eNBs may have similar frame timing, and transmissions from different eNBs may be approximately aligned in time. For asynchronous operation, the eNBs may have different frame timing, and transmissions from different eNBs may not be aligned in time. The techniques described herein may be used for either synchronous or asynchronous operations.

A network controller 130 may couple to a set of eNBs and provide coordination and control for these eNBs. The network controller 130 may communicate with the eNBs 110 via a backhaul 132. The eNBs 110 may also communicate with one another, e.g., directly or indirectly via a wireless backhaul 134 or a wireline backhaul 136.

The UEs 120 are dispersed throughout the wireless network 100, and each UE may be stationary or mobile. A UE may also be referred to as a terminal, a mobile station, a subscriber unit, a station, or the like. A UE may be a cellular phone, a personal digital assistant (PDA), a wireless modem, a wireless communication device, a handheld device, a laptop computer, a cordless phone, a wireless local loop (WLL) station, or the like. A UE may be able to communicate with macro eNBs, pico eNBs, femto eNBs, relays, and the like. In FIG. 1, a solid line with double arrows indicates desired transmissions between a UE and a serving eNB, which is an eNB designated to serve the UE on the downlink and/or uplink. A dashed line with double arrows indicates interfering transmissions between a UE and an eNB.

LTE/-A utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, or the like. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for a corresponding system bandwidth of 1.25, 2.5, 5, 10 or 20 megahertz (MHz), respectively. The system bandwidth may also be partitioned into sub-bands. For example, a sub-band may cover 1.08 MHz (i.e., 6 resource blocks), and there may be 1, 2, 4, 8 or 16 sub-bands for a corresponding system bandwidth of 1.25, 2.5, 5, 10 or 20 MHz, respectively.

Figure 2:
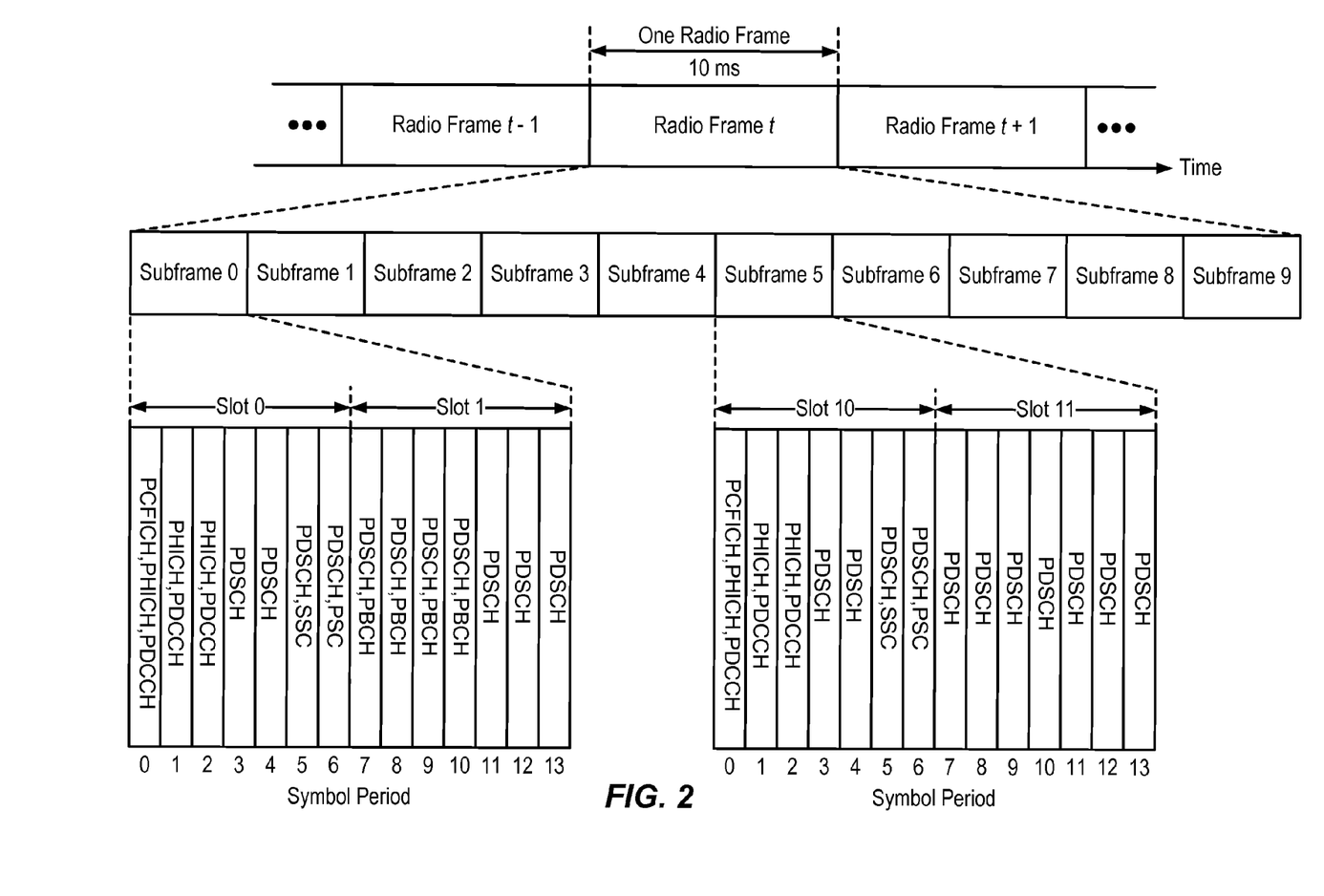
FIG. 2 is a block diagram conceptually illustrating an example of a downlink frame structure in a mobile communication system.

FIG. 2 shows a downlink FDD frame structure used in LTE/-A. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (as shown in FIG. 2) or 14 symbol periods for an extended cyclic prefix. The 2L symbol periods in each subframe may be assigned indices of 0 through 2L−1. The available time frequency resources may be partitioned into resource blocks. Each resource block may cover N subcarriers (e.g., 12 subcarriers) in one slot.

In LTE/-A, an eNodeB may send a primary synchronization signal (PSC or PSS) and a secondary synchronization signal (SSC or SSS) for each cell in the eNodeB. For FDD mode of operation, the primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. For FDD mode of operation, the eNodeB may send a Physical Broadcast Channel (PBCH) in symbol periods 0 to 3 in slot 1 of subframe 0. The PBCH may carry certain system information.

The eNodeB may send a Physical Control Format Indicator Channel (PCFICH) in the first symbol period of each subframe, as seen in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNodeB may send a Physical HARQ Indicator Channel (PHICH) and a Physical Downlink Control Channel (PDCCH) in the first M symbol periods of each subframe. The PDCCH and PHICH are also included in the first three symbol periods in the example shown in FIG. 2. The PHICH may carry information to support hybrid automatic retransmission (HARQ). The PDCCH may carry information on uplink and downlink resource allocation for UEs and power control information for uplink channels. The eNodeB may send a Physical Downlink Shared Channel (PDSCH) in the remaining symbol periods of each subframe. The PDSCH may carry data for UEs scheduled for data transmission on the downlink.

The eNodeB may send the PSC, SSC and PBCH in the center 1.08 MHz of the system bandwidth used by the eNodeB. The eNodeB may send the PCFICH and PHICH across the entire system bandwidth in each symbol period in which these channels are sent. The eNodeB may send the PDCCH to groups of UEs in certain portions of the system bandwidth. The eNodeB may send the PDSCH to specific UEs in specific portions of the system bandwidth. The eNodeB may send the PSC, SSC, PBCH, PCFICH and PHICH in a broadcast manner to all UEs, may send the PDCCH in a unicast manner to specific UEs, and may also send the PDSCH in a unicast manner to specific UEs.

A UE may know the specific REGs used for the PHICH and the PCFICH. The UE may search different combinations of REGs for the PDCCH. The number of combinations to search is typically less than the number of allowed combinations for the PDCCH. An eNodeB may send the PDCCH to the UE in any of the combinations that the UE will search.

Figure 3:
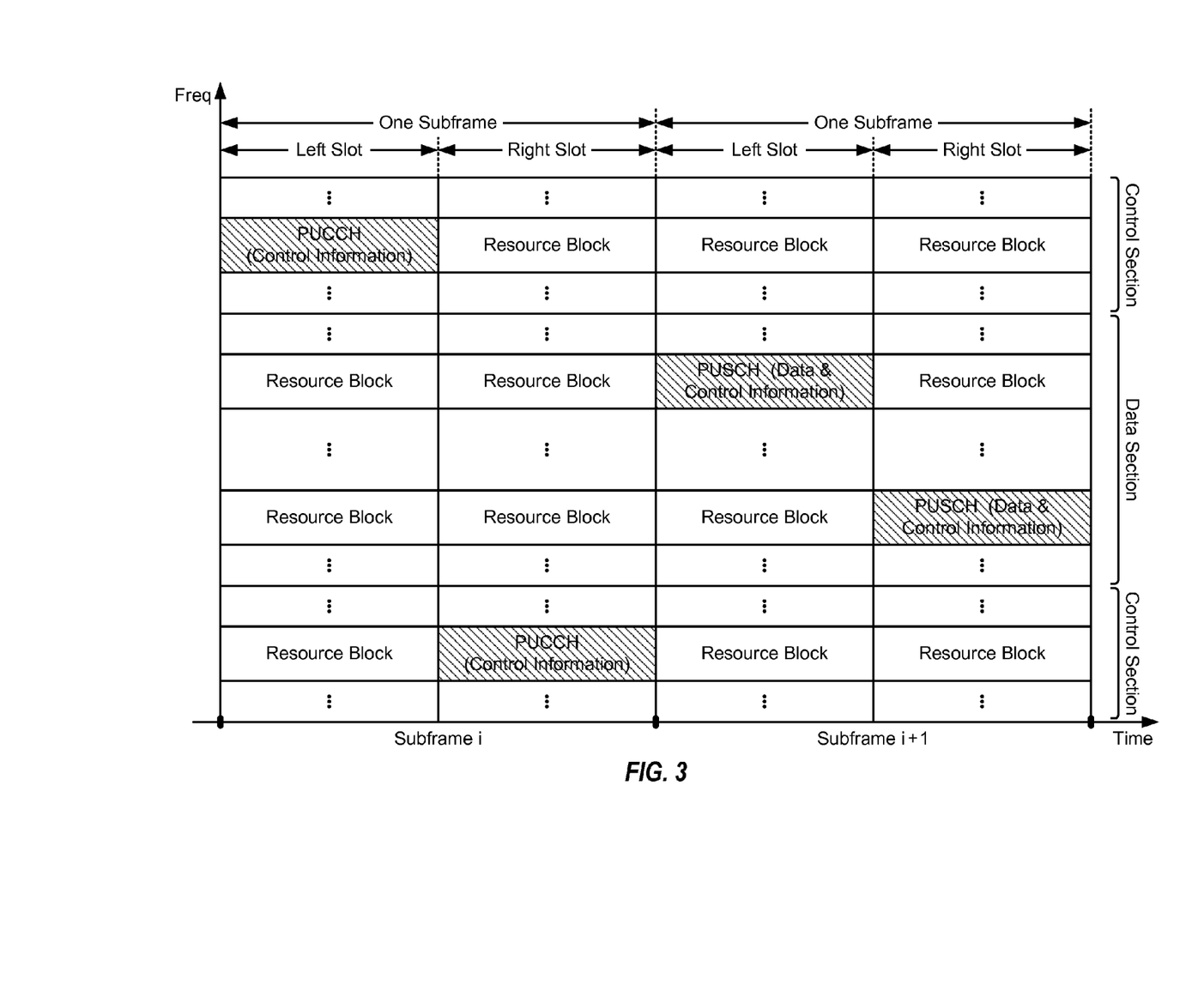
FIG. 3 is a block diagram conceptually illustrating an exemplary frame structure in uplink communications.

A UE may be within the coverage of multiple eNodeBs. One of these eNodeBs may be selected to serve the UE. The serving eNodeB may be selected based on various criteria such as received power, path loss, signal-to-noise ratio (SNR), etc. FIG. 3 is a block diagram conceptually illustrating an exemplary frame structure in uplink long term evolution (LTE) communications. The available resource blocks (RBs) for the uplink may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The design in FIG. 3 results in the data section including contiguous subcarriers, which may allow a single UE to be assigned all of the contiguous subcarriers in the data section.

A UE may be assigned resource blocks in the control section to transmit control information to an eNB. The UE may also be assigned resource blocks in the data section to transmit data to the eNode B. The UE may transmit control information in a Physical Uplink Control Channel (PUCCH) on the assigned resource blocks in the control section. The UE may transmit only data or both data and control information in a Physical Uplink Shared Channel (PUSCH) on the assigned resource blocks in the data section. An uplink transmission may span both slots of a subframe and may hop across frequency as shown in FIG. 3. According to one aspect, in relaxed single carrier operation, parallel channels may be transmitted on the UL resources. For example, a control and a data channel, parallel control channels, and parallel data channels may be transmitted by a UE.

Figure 4:
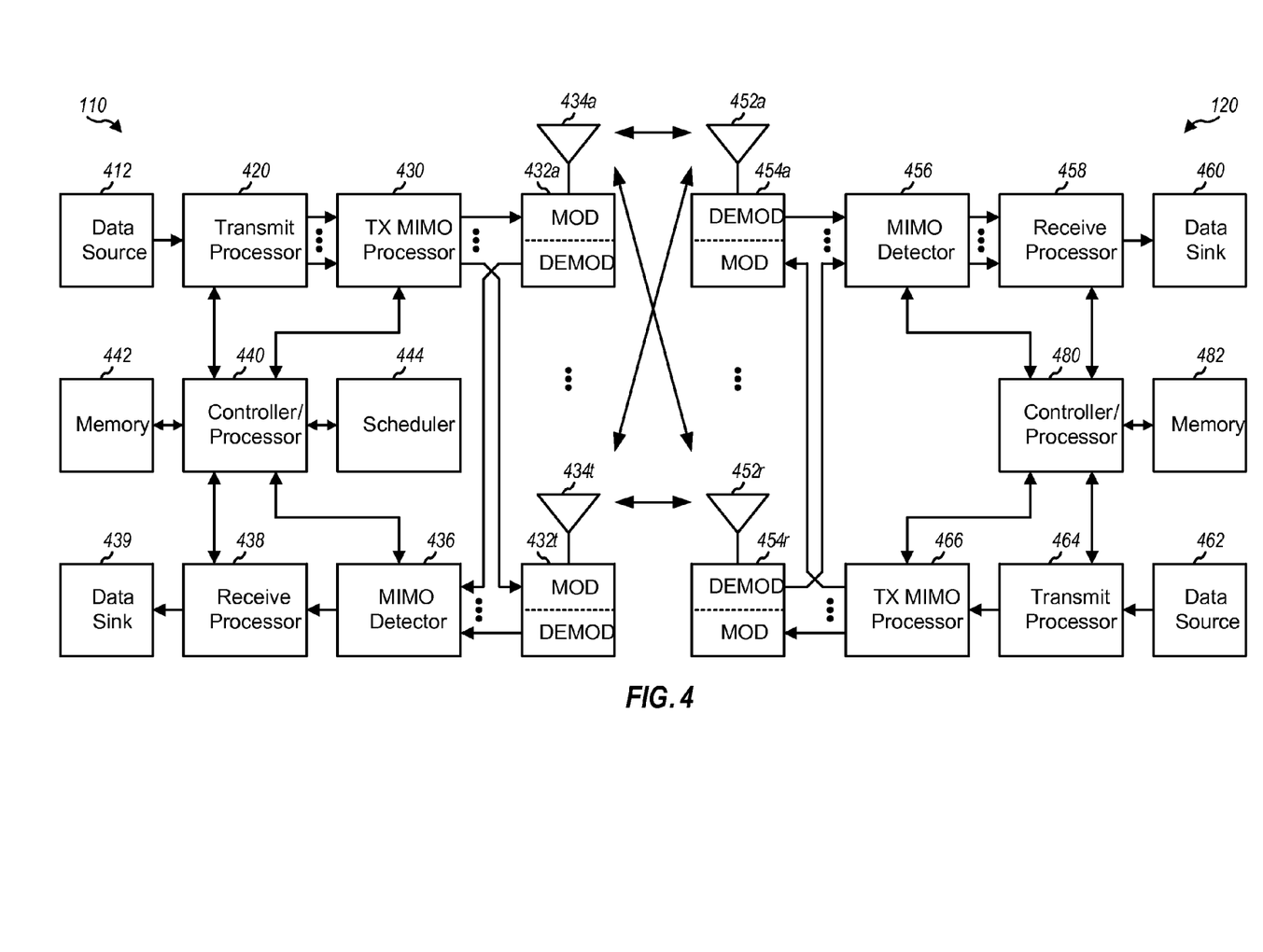
FIG. 4 is a block diagram conceptually illustrating a design of a base station/eNB and a UE configured according to one aspect of the present disclosure.

FIG. 4 shows a block diagram of a design of a base station/ eNB 110 and a UE 120, which may be one of the base stations/eNBs and one of the UEs in FIG. 1. The base station 110 may be the macro eNB 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the PBCH, PCFICH, PHICH, PDCCH, etc. The data may be for the PDSCH, etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the PUSCH) from a data source 462 and control information (e.g., for the PUCCH) from the controller/processor 480. The processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the base station 110, the uplink signals from the UE 120 may be received by the antennas 434, processed by the modulators 432, detected by a MIMO detector 436 if applicable, and further processed by a receive processor 438 to obtain decoded data and control information sent by the UE 120. The processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules (including receive processor 438 and memory 442) at the base station 110 may perform or direct the execution of various processes for the techniques described herein, including the functional blocks illustrated in FIG. 5 or 6. The processors 480 and/or other processors and modules at the UE 120 may also perform or direct the execution of various processes for the techniques described herein. The memories 442 and 482 may store data and program codes for the base station 110 and the UE 120, respectively. A scheduler 444 may schedule UEs for data transmission on the downlink and/or uplink.

Convolutional codes (CC) are used in wireless communications systems to correct for errors in receiving wireless signals. By appending zeros at the end of information bits, a CC (called a terminated CC) starts and ends at state 0. Knowing that the signal starts and ends at state 0 improves decoding and identification of the correct signal. The decoding of a terminated CC that minimizes the codeword error rate uses the known Viterbi algorithm (VA), which finds the most likely codeword (path) which starts and ends at state 0. While terminated CCs have the benefit of starting and ending at the same known state (state 0), they also require extra bits to be added, thereby reducing the effective data rate. Tail biting CCs (TBCC) are a type of CC created by cyclic shifting the last few information bits (tail bits) in a CC to the beginning. Accordingly, the TBCC starts and ends at the same state (determined by these tail bits) without the impact to data rates of state 0 terminated CCs. However, this results in increased decoding complexity due to the uncertainty associated with determining the starting/ending state.

In one example, TBCCs have been used for the Physical Broadcast Channel (PBCH) and Physical Downlink Control Channel (PDCCH) in LTE downlink transmission. Because the receiver state is generally unknown, a near-optimal decoding process for TBCC is usually composed of 2 steps:
1. Estimate the initial state; and
2. Find the mostly likely codeword path which starts and ends at this given state.

Therefore, the decoding complexity of TBCC is higher than that of terminated CC but the energy on transmitting tail bits is saved.

In one aspect, for a wireless communication system, a cyclic redundancy check (CRC) code is attached to the information bits for error detection. For the PBCH channel, for example, a 16 bit CRC is added to a 24 bit payload. Therefore, there is a certain amount of redundancy in the CRC bits. If the redundancy provided by the CRC is exploited, the error performance of the Viterbi algorithm may be improved. List Viterbi algorithm (LVA) is an algorithm that may improve performance. Instead of providing only a single most likely codeword (which is what is provided from application of the traditional Viterbi algorithm), application of LVA produces a list of potential codewords (list size L), and uses the CRC to select the correct codeword from the list of potential codewords. By providing multiple codewords, LVA provides a better chance of including the correct codeword, but in exchange consumes greater resources for computing power. LVA for terminated CC has a complexity that is roughly L times that of VA. However, the application of LVA to TBCC is not as straightforward.

In one example, an improved solution is to run LVA at each state, choose the best L codewords, and use the CRC to select the correct codeword. For a TBCC with memory m, the number of states is $2^m$ so a desired solution is roughly $2^m$ L times more complex than that of traditional Viterbi algorithm. This complexity can provide some difficulty from an implementation point of view.

In one aspect, the present disclosure provides a low complexity LVA for TBCC, which has complexity roughly $L_s L_c + 3$ times that of the Viterbi algorithm, where $L_s$ is the list size of state estimates and $L_c$ is the list size of codeword estimates for each state in the state list. In one example, the low complexity LVA for TBCC includes the following steps:
1. Find a list of most likely states;
2. Find a list of codewords for each state;
3. The final list is the best L out of $L_s L_c$ codewords;
4. Use CRC code to find the final solution.

Figure 5:
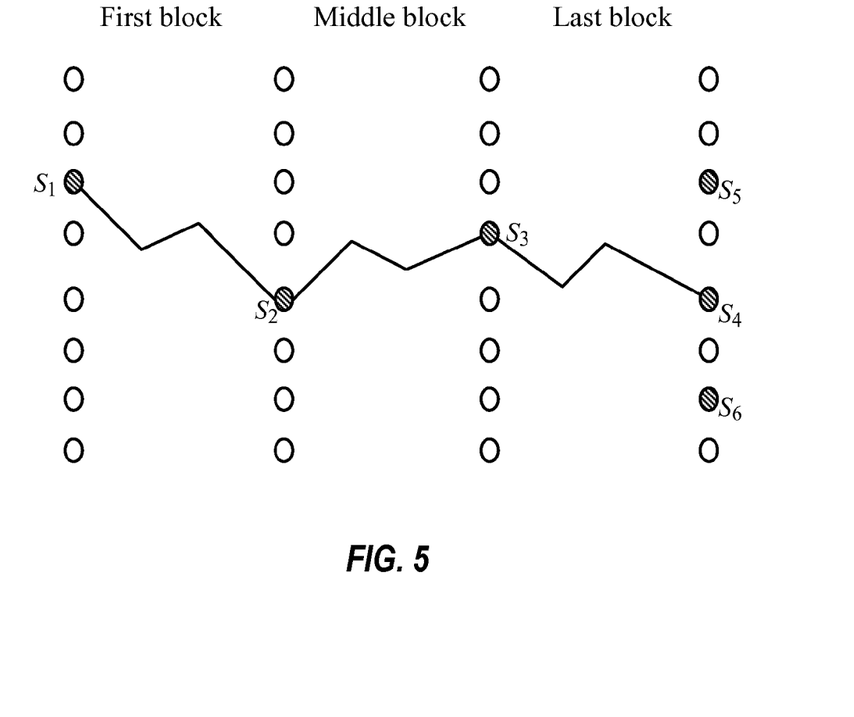
FIG. 5 illustrates an example for finding the list of states for a first step of the List Viterbi algorithm (LVA).

In one example, the disclosed LVA for TBCC improves TBCC performance FIG. 5 illustrates a trellis diagram showing an example for finding the list of states for a first step of the List Viterbi algorithm (LVA). A received signal is replicated into three trellis blocks, a first, middle, and last block. Thus, the received bits are repeated three times, once into each of the three trellis blocks. As the initial/ending state for the TBCC is unknown, the Viterbi algorithm (VA) applies an equal probability to each potential initial state. With the potential states at the end of the third trellis block, the best path (representing the most likely received codeword) is chosen. Without the LVA, the codeword corresponding to the middle part of the best path between $S_2$ and $S3$ would be the decoded codeword and state $S_2$ (the initial state of the middle block) would be the state estimate for the Viterbi algorithm decoding of TBCC.

In one disclosed aspect employing LVA, obtaining the list of states also uses the replicated received signal trellis blocks. In this aspect, the list of states is obtained as follows:

1. A single Viterbi algorithm is used to determine a best codeword, from which the potential states are taken. Each new state at the block boundaries along the best codeword of the trellis diagram is added to the list in order. The potential states at the edges of the middle block may be the most reliable, and so are added to the list of potential states first. If a state is the same as a previous state on the list, it is not added. For the example shown in FIG. 5, states are added to the list according to the order of $S_2$, $S_3$, $S_1$ and $S_4$ if they are different from previous states;
2. If the list is not full, add the state to the list according to the end state metric at the last block (if the state is different from previous states). For example, if a desired length of the state list is five states, and only three unique states are found, additional states may be added by taking states having the most desirable accumulated metric value following the Viterbi algorithm. Enough states are added to completely populate the state list to its desired number;
3. Keep adding new states to the list until the list is full.

A conventional method of performing LVA processing does not implement the repeated trellis signal blocks as described above. In the conventional method, multiple Viterbi algorithms with different repetition factors are employed to determine multiple potential best paths and consequently a list of multiple potential states. Those multiple potential best states are then each processed by a List Viterbi Algorithm to yield multiple lists with multiple candidate paths. Only then are candidate paths narrowed to create a list of potential global best paths. This process consumes significant computation resources.

In a disclosed aspect, a single Viterbi algorithm is initially used to determine a best codeword from which the potential states are taken. The state list is further populated according to end state metrics until the state list is full. Using a single Viterbi algorithm for this step conserves computation resources and results in a desired solution more efficiently than the proposed method of the '186 patent.

Figure 6:
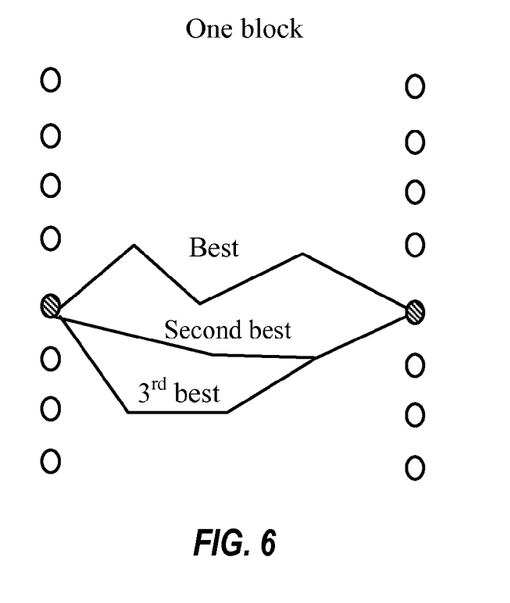
FIG. 6 illustrates an example for producing multiple codewords for each state in the list of states in FIG. 5.

Once the state list is determined, List Viterbi algorithm (LVA) may be applied to determine a list of potential codewords for each state. These potential codewords may be ranked in order of their probability of being the correct codeword used to correctly represent received data. FIG. 6 illustrates an example for producing multiple codewords in a single block for each state in the list of states from the trellis diagram shown in FIG. 5. LVA provides choices for potential codewords, which may be ranked. Error checking such as CRC may then be applied to determine which of the possible codewords is chosen as the correct one.

In certain cases $L_s$ or $L_c$ may only have a list size of one. In the case of $L_c$ having a list size of one, the computational complexity of the decoding operation is reduced and conventional Viterbi algorithm processing hardware may be employed to determine the received signal.

As noted above, prior to the application of the LVA, each state is equally weighted for the probability of being the correct start/end state. Following application of the LVA, each state is given a value according to a metric, which is used to weight each state as the potential correct start/end state. With a metric assigned to each state, more likely states may be used in determining potential codewords, thereby improving the performance of finding the most likely codeword. In one aspect, codewords are also assigned values according to a metric, thereby placing weights on the codewords as to which are more likely to be correct. In one aspect, only the L codewords with the lowest value of a codeword metric are used in determining the correct codeword. Such pruning may provide a reduction in computing power necessary to determine the correct codeword.

In one example, the performance of the LVA applied to the LTE PBCH channel in independent and identically distributed (i.i.d.) channels with different state list size $L_s$ and codeword list size $L_c$ combinations is improved as the state list size or codeword list size is increased. For example, with one state, the LVA can provide up to 0.3 dB gain; as the number of states is increased, the performance is about 0.7 dB gain at a block error rate (BLER) of 10-2.

Figure 7:
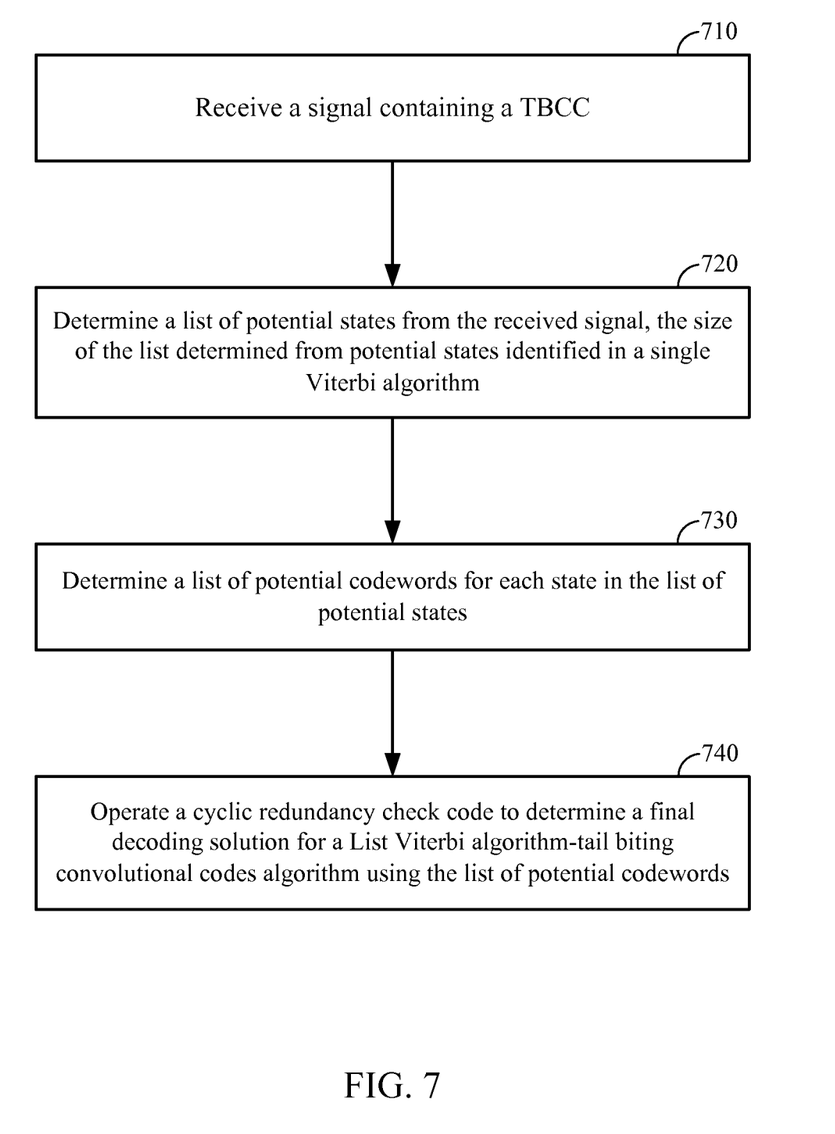
FIG. 7 illustrates an example flow diagram for decoding tail biting convolutional codes (TBCC) using a List Viterbi algorithm (LVA).

FIG. 7 illustrates an example flow diagram for decoding tail biting convolutional codes (TBCC) using a List Viterbi algorithm (LVA). In block 710, a signal containing a TBCC is received. In block 720, a list of potential states is determined from the received signal, the size of the list being Ls, Ls being determined from potential states identified in a single Viterbi algorithm. In block 730, a list of potential codewords for each state in the list of potential states is determined, the size of the list of potential codewords being Lc. In block 740, a cyclic redundancy check (CRC) code is operated to determine a final decoding solution for a List Viterbi algorithm (LVA)-tail biting convolutional codes (TBCC) algorithm using the list of potential codewords.

The present disclosure discloses a low complexity List Viterbi algorithm (LVA) for decoding tail biting convolutional codes (TBCC) with lower complexity than the solution of running the LVA algorithm for all states. In one aspect, a low complexity LVA-TBCC process employing repeated signal trellis blocks includes finding a list of states and finding a list of codewords for each state in the state list. A CRC may be used to prune out the false solutions. In one example, performance analysis for the LTE PBCH channel has shown 0.7 dB performance gain. This is due to the fact that a 16 bit CRC is used on a 24 bit PBCH payload and LVA effectively exploits a redundancy in the CRC bits to improve the code performance. The disclosed method may be applied to many communication systems to improve error performance similar to LTE downlink PBCH decoding enhancements.

In one configuration, a base station 110 is configured for wireless communication including means for receiving a signal containing a TBCC, means for determining a list of potential states from the received signal, means for determining a list of potential codewords for each state in the list of potential states, and means for operating a cyclic redundancy check (CRC) code to determine a final decoding solution for a List Viterbi algorithm (LVA)-tail biting convolutional codes (TBCC) algorithm using the list of potential codewords. In one aspect, the aforementioned means may be the receive processor 438, the controller/processor 440, and/or the memory 442 configured to perform the functions recited by the aforementioned means. In another aspect, the aforementioned means may be a module or any apparatus configured to perform the functions recited by the aforementioned means.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functional blocks and modules described above, may comprise processors, electronics devices, hardware devices, electronics components, logical circuits, memories, software codes, firmware codes, etc., or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method in a wireless communication system for decoding tail biting convolutional codes (TBCCs) with a List Viterbi algorithm (LVA), the method comprising:

receiving a signal containing a TBCC;

determining a list of potential states from the received signal, a size of the list being $L_s$, $L_s$ being determined from potential states identified in a single Viterbi algorithm;

determining a list of potential codewords for each state in the list of potential states, a size of the list of potential codewords being $L_c$;

operating a cyclic redundancy check (CRC) code to determine a final decoding solution for a List Viterbi algorithm (LVA)-tail biting convolutional codes (TBCC) algorithm using the list of potential codewords;

determining a plurality of state transitions by repeating the received signal into N signal blocks a predetermined number of times N;

determining a plurality of states, the plurality of states including beginning states and ending states that correspond to beginnings and endings of each signal block and including all ending states at an end of an Nth signal block; and generating the list of potential states by selecting states from the plurality of states until the list reaches a predetermined size.

2. The method of claim 1 wherein the generating a list of potential states comprises selecting beginning states falling between signal blocks starting with beginning states from a middle signal block and then continuing to beginning states from neighboring signal blocks until reaching the first and last signal blocks.

3. The method of claim 1 wherein the generating a list of potential states comprises selecting the ending states at a last signal block according to ending metric values, after selecting all beginning states falling between signal blocks.

4. The method of claim 1 further comprising determining a best list of codewords, a size of the best list L being the size of $L_s$ times the size of $L_c$.

5. The method of claim 1 in which $L_c$ comprises a single codeword.

6. The method of claim 1 in which the CRC code is operated on codewords having a metric value determined by the LVA beyond a certain threshold, the threshold being a predetermined value, or an Lth largest or smallest metric value among all $L_s L_c$ codewords.

7. An apparatus configured to operate in a wireless communication system and configured to decode tail biting convolutional codes (TBCCs) with a List Viterbi algorithm (LVA), the apparatus comprising:
  means for receiving a signal containing a TBCC;
  means for determining a list of potential states from the received signal, a size of the list being $L_{s, Ls}$ being determined from potential states identified in a single Viterbi algorithm;
  means for determining a list of potential codewords for each state in the list of potential states, a size of the list of potential codewords being $L_c$;
  means for operating a cyclic redundancy check (CRC) code to determine a final decoding solution for a List Viterbi algorithm (LVA)-tail biting convolutional codes (TBCC) algorithm using the list of potential codewords;
  means for determining a plurality of state transitions by repeating the received signal into N signal blocks a predetermined number of times N;
  means for determining a plurality of states, the plurality of states including beginning states and ending states that correspond to beginnings and endings of each signal block and including all ending states at an end of an Nth signal block; and
  means for generating the list of potential states by selecting states from the plurality of states until the list reaches a predetermined size.

8. The apparatus of claim 7 wherein the means for generating a list of potential states comprises means for selecting beginning states falling between signal blocks starting with beginning states from a middle signal block and then continuing to beginning states from neighboring signal blocks until reaching the first and last signal blocks.

9. A computer program product configured for decoding tail biting convolutional codes (TBCCs) with a List Viterbi algorithm (LVA), the computer program product comprising:
  a non-transitory computer-readable medium having program code recorded thereon, the program code comprising:
  program code to receive a signal containing a TBCC;
  program code to determine a list of potential states from the received signal, a size of the list being $L_s$, $L_s$ being determined from potential states identified in a single Viterbi algorithm;
  program code to determine a list of potential codewords for each state in the list of potential states, a size of the list of potential codewords being $L_c$;
  program code to operate a cyclic redundancy check (CRC) code to determine a final decoding solution for a List Viterbi algorithm (LVA)-tail biting convolutional codes (TBCC) algorithm using the list of potential codewords;
  program code to determine a plurality of state transitions by repeating the received signal into N signal blocks a predetermined number of times N;
  program code to determine a plurality of states, the plurality of states including beginning states and ending states that correspond to beginnings and endings of each signal block and including all ending states at an end of an Nth signal block; and
  program code to generate the list of potential states by selecting states from the plurality of states until the list reaches a predetermined size.

10. The computer program product of claim 9 wherein the program code to generate a list of potential states comprises program code to select beginning states falling between signal blocks starting with beginning states from a middle signal block and then continuing to beginning states from neighboring signal blocks until reaching the first and last signal blocks.

11. An apparatus configured for decoding tail biting convolutional codes (TBCCs) with a List Viterbi algorithm (LVA), the apparatus comprising:
  at least one processor; and
  a memory coupled to the at least one processor, the at least one processor being configured:
  to receive a signal containing a TBCC;
  to determine a list of potential states from the received signal, a size of the list being $L_s$, $L_s$ being determined from potential states identified in a single Viterbi algorithm;
  to determine a list of potential codewords for each state in the list of potential states, a size of the list of potential codewords being $L_c$;
  to operate a cyclic redundancy check (CRC) code to determine a final decoding solution for a List Viterbi algorithm (LVA)-tail biting convolutional codes (TBCC) algorithm using the list of potential codewords;
  to determine a plurality of state transitions by repeating the received signal into N signal blocks a predetermined number of times N;
  to determine a plurality of states, the plurality of states including beginning states and ending states that correspond to beginnings and endings of each signal block and including all ending states at an end of an Nth signal block; and
  to generate the list of potential states by selecting states from the plurality of states until the list reaches a predetermined size.

12. The apparatus of claim 11 wherein the at least one processor being configured to generate a list of potential states comprises the at least one processor being configured to select beginning states falling between signal blocks starting with beginning states from a middle signal block and then continuing to beginning states from neighboring signal blocks until reaching the first and last signal blocks.

13. The apparatus of claim 11 wherein the at least one processor being configured to generate a list of potential states comprises the at least one processor being configured to select the ending states at a last signal block according to ending metric values, after selecting all beginning states falling between signal blocks.

14. The apparatus of claim 11 in which the at least one processor is further configured to determine a best list of codewords, a size of the best list L being the size of $L_s$ times the size of $L_c$.

15. The apparatus of claim 11 in which $L_c$, comprises a single codeword.

16. The apparatus of claim 11 in which the CRC code is operated on codewords having a metric value determined by the LVA beyond a certain threshold, the threshold being a predetermined value, or an Lth largest or smallest metric value among all $L_s L_c$ codewords.

* * * * *